(12) United States Patent
Pearson et al.

(10) Patent No.: US 6,501,658 B2
(45) Date of Patent: Dec. 31, 2002

(54) HEATSINK MOUNTING WITH SHOCK ABSORBERS

(75) Inventors: Tom E. Pearson, Beaverton, OR (US); Arjang Fartash, Aloha, OR (US); Christopher Combs, Portland, OR (US); Raiyomand F. Aspandiar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 09/788,128

(22) Filed: Feb. 16, 2001

(65) Prior Publication Data

US 2002/0114137 A1 Aug. 22, 2002

(51) Int. Cl.$^7$ ................................................. H05K 7/20
(52) U.S. Cl. ........................ 361/709; 361/698; 361/704; 361/712; 257/718; 174/16.3
(58) Field of Search ................................ 361/694–698, 361/699–712, 713–717, 719–721, 809; 257/706–727, 734, 737–738, 778; 174/15.1, 15.2, 16.1, 16.3; 165/80.2, 80.3, 80.4, 185; 439/66, 71, 74, 86, 90–91, 485, 526, 591

(56) References Cited

U.S. PATENT DOCUMENTS

| | | | | |
|---|---|---|---|---|
| 4,487,300 A | * | 12/1984 | Hammond | .................. 188/378 |
| 4,721,996 A | * | 1/1988 | Tustaniwskyi et al. | ........ 357/82 |
| 5,754,400 A | * | 5/1998 | Sathe et al. | .................. 361/704 |
| 5,757,621 A | * | 5/1998 | Patel | ........................... 361/719 |
| 5,901,039 A | * | 5/1999 | Dehaine et al. | ............. 361/704 |
| 5,920,120 A | * | 7/1999 | Webb et al. | ................. 257/719 |
| 5,958,556 A | * | 9/1999 | McCutcheon | ............... 428/172 |
| 6,023,413 A | * | 2/2000 | Umezawa | .................... 361/697 |
| 6,356,445 B1 | * | 3/2002 | Mochzuki et al. | .......... 361/697 |

FOREIGN PATENT DOCUMENTS

| | | | | |
|---|---|---|---|---|
| DE | 3735985 A1 | * | 5/1988 | ............ H05K/7/20 |
| JP | 404186752 A | * | 7/1992 | ............ H01L/23/40 |
| JP | 407273480 A | * | 10/1995 | ............ H05K/7/20 |
| JP | 410070383 A | * | 3/1998 | ............ H05K/7/20 |
| JP | 410070222 A | * | 10/1998 | ............ H01L/23/40 |
| JP | 411163232 A | * | 6/1999 | ............ H01L/23/36 |
| JP | 02000174182 A | * | 6/2000 | ............ H01L/23/36 |

* cited by examiner

*Primary Examiner*—Darren Schuberg
*Assistant Examiner*—Michael Datskovsky
(74) *Attorney, Agent, or Firm*—Trop, Pruner & Hu, P.C.

(57) ABSTRACT

Shock absorbers or other dampening mechanisms are added to an assembly including a heatsink, a semiconductor device, and a board, to reduce shock and/or vibration induced relative motion between the heatsink and the board.

17 Claims, 4 Drawing Sheets

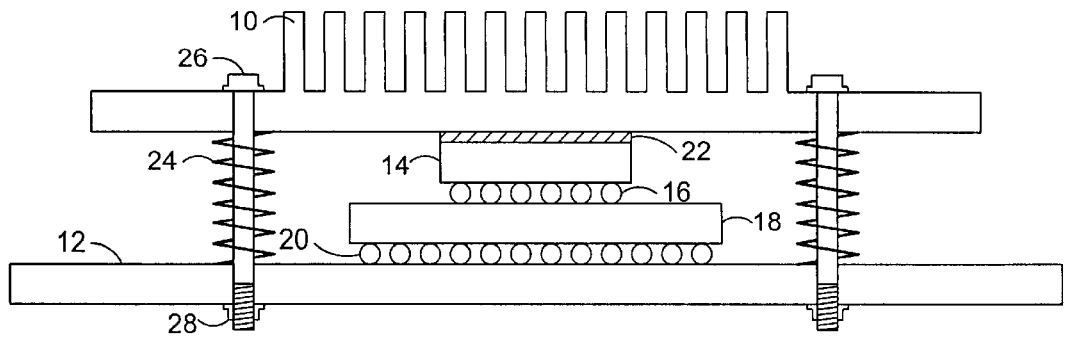
Fig. 1 - prior art
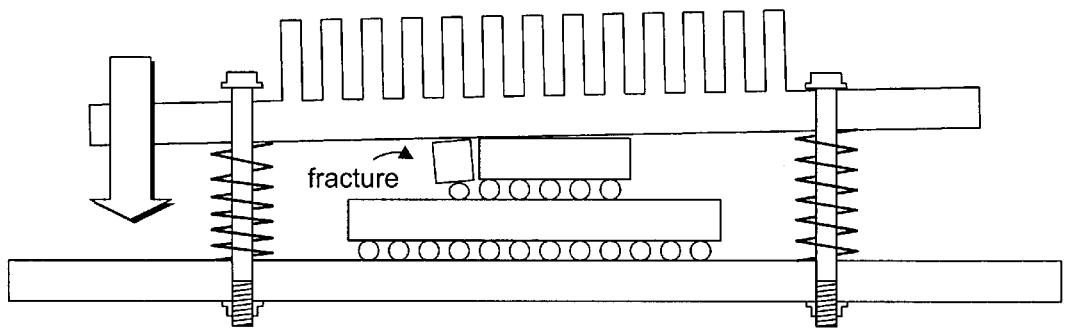
Fig. 2 - prior art
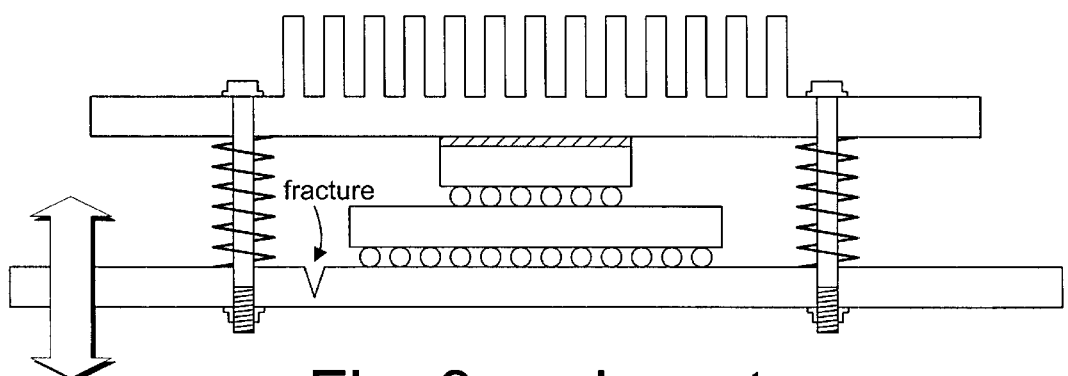
Fig. 3 - prior art

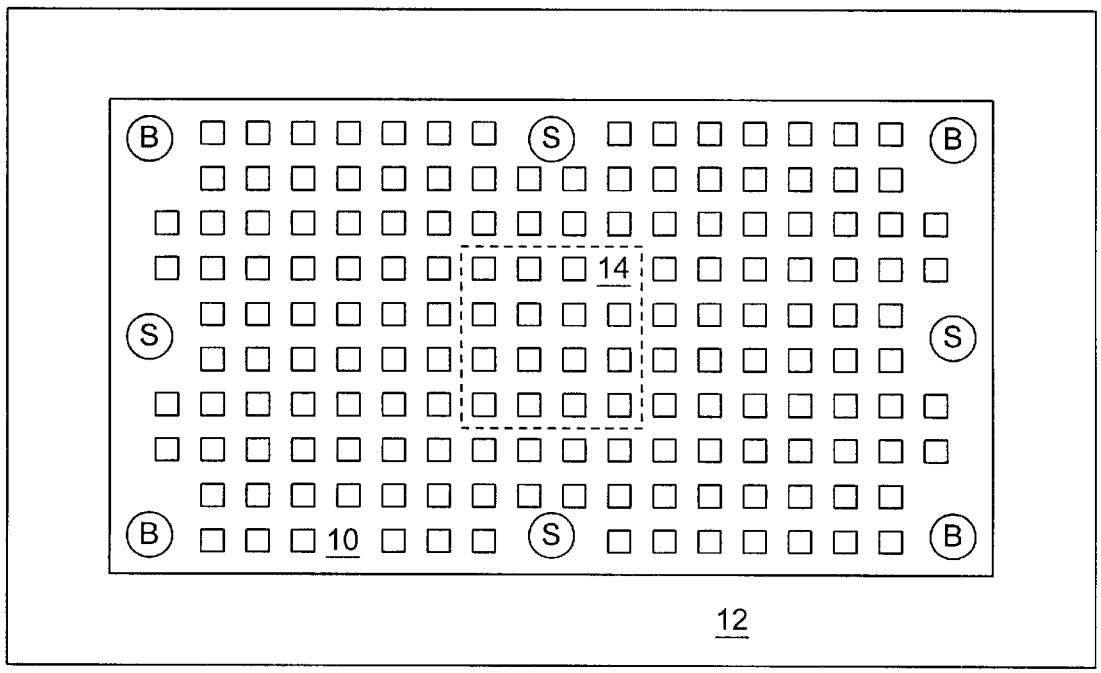
Fig. 11
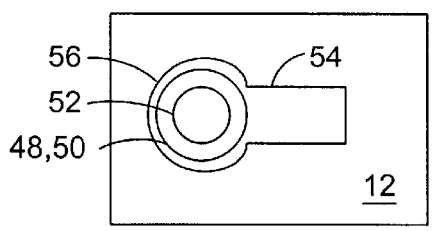   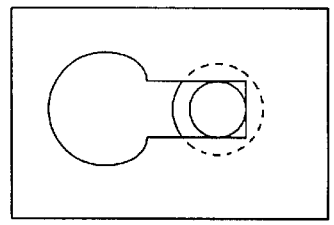
Fig. 12     Fig. 13

HEATSINK MOUNTING WITH SHOCK ABSORBERS

BACKGROUND OF THE INVENTION

1. Technical Field of the Invention

The present invention relates generally to mounting of heatsinks and the like to semiconductor devices, motherboards, and the like. More specifically, it relates to dampening measures for such mounting.

2. Background Art

FIG. 1 illustrates a known technique for mounting a heatsink 10 to a chip assembly on a motherboard 12. The chip assembly may, for example, include a microelectronic die 14 (such as a flip-chip die) connected by bumps 16 to a card 18 which is connected by solder balls 20 to the motherboard. Typically, thermal grease 22 is used to provide good thermal mating of the die and the heatsink.

In applications where the heatsink is quite heavy, springs 24 are used to support the weight of the heatsink, taking the weight off of the die and card. The heatsink is attached, and the springs are drawn into compression, by bolts 26 and nuts 28.

While the springs may do an adequate job of supporting the heatsink under stationary conditions, they have been found inadequate in applications where the assembly is subject to significant shock or vibration.

FIG. 2 illustrates one problem that exists in this prior art. When subjected to shock or vibration, the heatsink travels downward, further compressing the spring. If the shock or vibration is severe enough in amplitude or duration, the heatsink may eventually impact the die with sufficient force to break the die or at least some of the interconnects. In the prior art, the solution has been to use stiffer springs in such applications, to reduce the tendency of the heatsink to impact the die. Unfortunately, this introduces another problem.

FIG. 3 illustrates what can happen if the springs are too strong and/or are drawn down with excessive preload and/or if the heatsink is subjected to shock or vibration with a significant upward component. In severe cases, the motherboard itself may fracture or suffer failure of its electrical traces or other devices. Even if the springs are not the problem, the motherboard may fail on its own, due to vibration or oscillation.

It is desirable to dampen the movement of the heatsink and motherboard relative to each other and relative to the other components of the assembly.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

FIG. 1 shows, in cross-section, a heatsink attach system according to the prior art, in which springs are used to support the heatsink.

FIG. 2 shows, in cross-section, the heatsink breaking the semiconductor die under shock or vibration.

FIG. 3 shows, in cross-section, the motherboard fracturing under shock or vibration or excessive spring preload.

FIG. 11 shows, in top view, one embodiment of a placement of the shock absorbers.

FIGS. 12 and 13 show, in top view, one embodiment of an attachment mechanism for the shock absorber.

DETAILED DESCRIPTION

Embodiments of the invention are shown in this patent in an application involving a flip-chip die assembly, but the skilled reader will appreciate that the invention is not limited to such applications.

Figure 4:
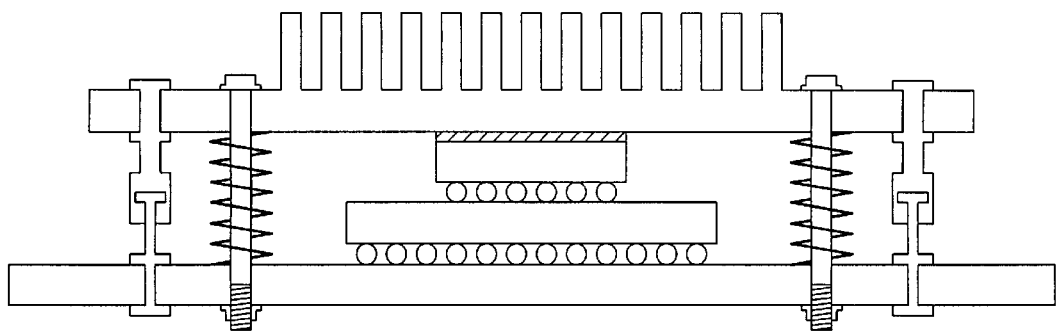
FIG. 4 shows, in cross-section, one embodiment of the invention, in which shock absorbers are added to the assembly to dampen shock and vibration.

FIG. 4 illustrates one embodiment of the invention, in which the shock absorbers 30 are mounted in parallel with the springs, bolts, or other heatsink supporting means. In some such embodiments, it may be desirable to place the shock absorbers as near the springs and hold-down bolts as possible. In others, it may be desirable to place the shock absorbers elsewhere. For example, in some applications it may be desirable to place the shock absorbers as near the ends of the heatsink as practicable, to maximize their effect in preventing the heatsink from levering about a fulcrum (the die).

Figure 5:
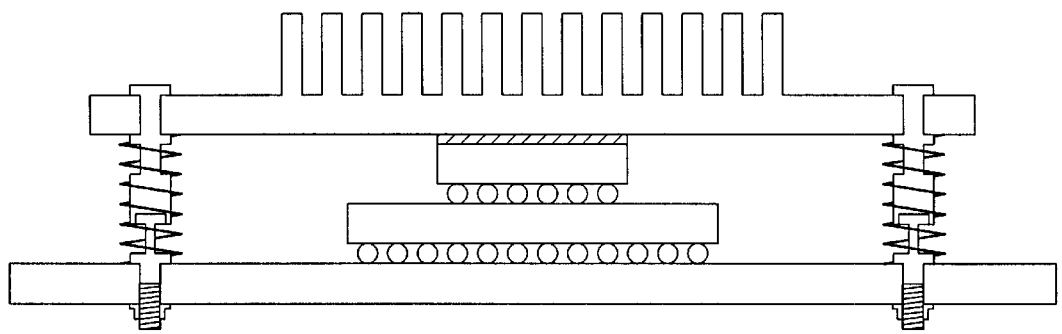
FIG. 5 shows, in cross-section, another embodiment in which the springs and shock absorbers are coaxially mounted.

FIG. 5 illustrates another embodiment of the invention, in which the shock absorbers are mounted serially, or coaxially, with the springs. In some such embodiments, the hold-down bolts may be omitted, and the shock absorbers may perform the hold-down function.

Figure 6:
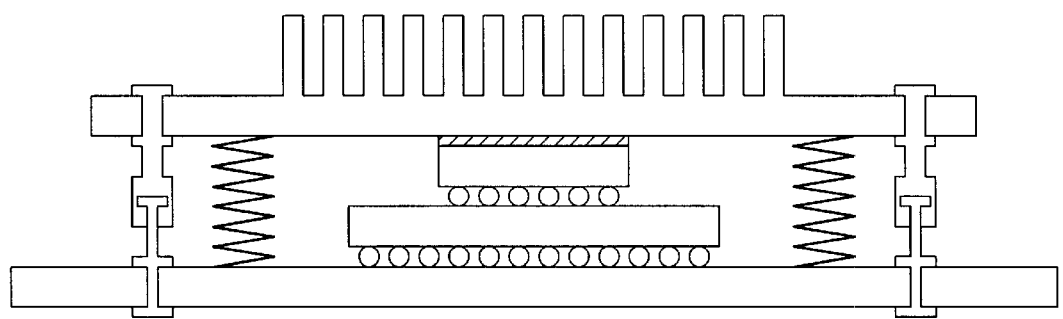
FIG. 6 shows, in cross-section, another embodiment in which the springs are under tension rather than compression, obviating the need for hold-down bolts.

FIG. 6 illustrates yet another embodiment, in which the springs perform the hold-down function. In some such embodiments, the springs may under tension rather than compression. In such embodiments, the die will bear not only the weight of the heatsink, but also the tension of the springs. Thus, this embodiment may not be suitable for all applications. The reader will appreciate that the springs could readily be mounted coaxially with the shock absorbers.

Figure 7:
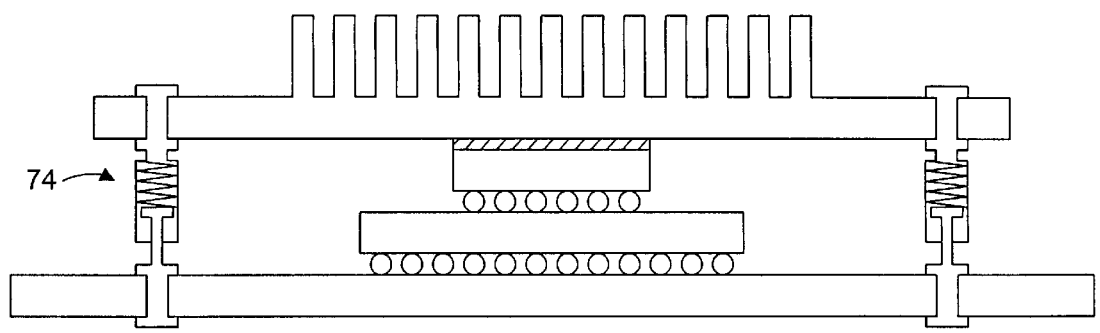
FIG. 7 shows, in cross-section, another embodiment in which the springs are integrated within the shock absorbers.

FIG. 7 illustrates yet another embodiment, utilizing shock absorbers which have integral springs. In various such embodiments, the springs may be under compression or tension. If under tension, the springs will, of course, need to be affixed to the shock absorbers rather than merely disposed within them in a free-floating manner.

Figure 8:
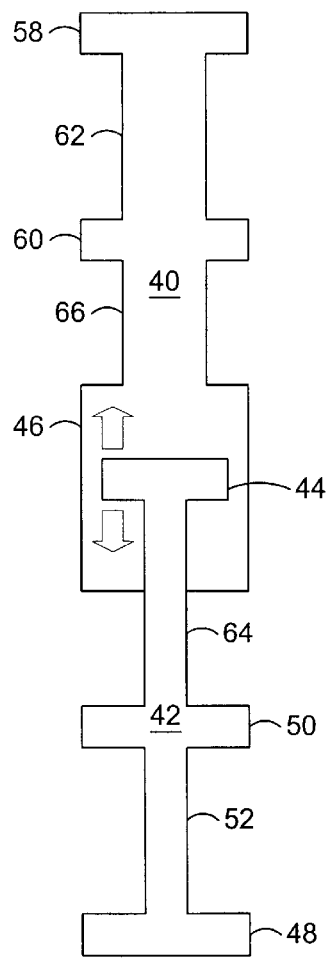
FIG. 8 shows, in cross-section, one embodiment of a shock absorber which is adapted for being affixed to the heatsink and motherboard.

FIG. 8 illustrates details of one exemplary shock absorber, such as those shown in FIG. 4. The shock absorber includes a cylinder component 40 and a piston component 42. The piston moves axially within the cylinder. The piston component 42 of the shock absorber includes an operative piston segment 44 sized appropriately to fit within an operative cylinder segment 46 of the cylinder component 40. In some embodiments, the dampening orifice may comprise a gap between the walls of the cylinder and the piston. In other embodiments, the dampening orifice may comprise one or more holes (not shown) through the piston or cylinder. In some embodiments, it may be desirable to employ pneumatic dampening, while in others it may be desirable to utilize hydraulic dampening. The choice of dampening mechanism, the selection of orifice sizes, fluid viscosities, and such are application dependent, and within the abilities of an ordinary skilled workman. In some embodiments, it may even be acceptable to use a frictional dampening mechanism, such as one in which two or more parts rub against each other to dampen motion in the direction of their overall assembly length. In some embodiments, it may be suitable to use a shock absorber with no moving parts, such as a rubber or plastic foam having a suitable "memory speed" and "memory pressure". The reader should appreciate that the various drawings, while illustrating piston and cylinder style shock absorbers, may also be interpreted as teaching the use of such foam or frictional dampening mechanisms.

Figure 9:
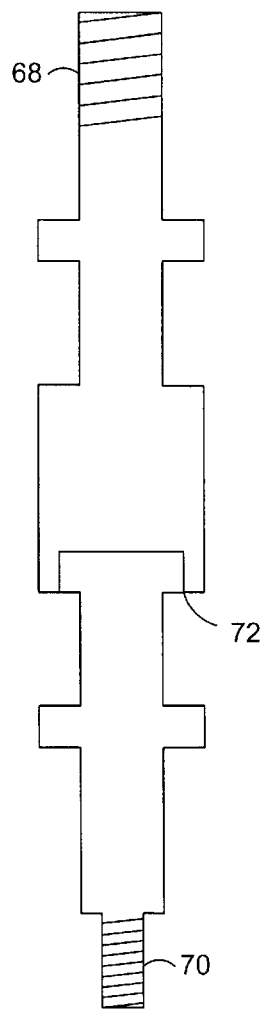
FIG. 9 shows, in cross-section, another embodiment of a shock absorber.

FIG. 9 illustrates another embodiment of the shock absorber, in which the end 68 of the cylinder component and the end 70 of the piston component are threaded. In this embodiment, they may be retained to the heatsink and the motherboard by threaded nuts (not shown). In some applications, it may be suitable to thread the piston or cylinder component directly to the heatsink.

Other retention mechanisms will be appreciated by the reader as being within the grasp of those of ordinary skill in this field. For example, the piston and/or cylinder components might include integral bolt heads. Or, they may be welded, glued, or otherwise affixed. FIG. 5 also illustrates that it is not necessarily required that the piston and the cylinder be affixed with the same mechanism.

FIG. 9 also illustrates what was mentioned previously with reference to FIG. 5, in that in some embodiments the shock absorber itself may provide the hold-down functionality that was done by separate bolts in the prior art and in other embodiments. In this embodiment, the piston and cylinder will, when installed, be topped out against one another at the inner lip of the end of the cylinder and the bottom edge of the piston, denoted as location 72. This configuration may be utilized in drawing the heatsink support spring into preload, as shown in FIG. 5.

Figure 10:
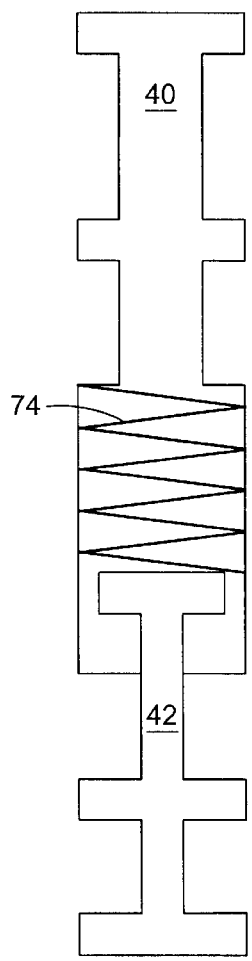
FIG. 10 shows, in cross-section, another embodiment of a shock absorber, with an integral spring.

FIG. 10 illustrates another embodiment of the shock absorber, such as that used in FIG. 7. In this embodiment, the shock absorber includes the spring 74 within the cylinder chamber. In applications where the spring is to be under tension, the spring is affixed to the cylinder portion 40 and the piston portion 42 of the shock absorber.

In some applications, it may be desirable to utilize both the main support springs external to the shock absorber, and also the internal shock absorber springs 74.

FIG. 11 illustrates that, in some embodiments, it is not necessarily desirable that the shock absorbers and the hold-down bolts be located near each other. FIG. 11 illustrates one such embodiment, in which the hold-down bolts or other such mechanism, denoted by the circles labeled B, are located at the corners of the heatsink, while the shock absorbers, denoted by the circles labeled S, are located in the middle of each side. The small squares stylistically represent multiple fins on the heatsink. The motherboard 12 is shown, and the outline of the chip 14 is shown as a dotted line.

FIGS. 12 and 13 illustrate one embodiment of an attachment mechanism for the shock absorbers, such as utilized in the applications shown in FIGS. 4, 6, and 7. Please refer to FIGS. 8, 12, and 13. The piston component includes an end cap 48, a middle cap 50, and a segment 52 having a diameter and length suitable for engaging a keyed slot 54 on the motherboard. The keyed slot includes a portion 56 sized sufficiently large to pass the end cap 48. The piston is inserted through the motherboard until the segment 52 is aligned with the motherboard, then the piston is slid into the keyhole, where the end cap and middle cap will mechanically grip the two sides of the motherboard, preventing axial movement of the piston relative to the motherboard, and the segment 52 will prevent lateral movement. The piston may be retained in this position by any suitable mechanism (not shown). For example, the end portion of the slot could be sized slightly larger than the rest of the slot, so the piston would be retained in a snap fit.

Similarly, in this embodiment, the cylinder portion 40 includes an end cap 58 and a middle cap 60 with a segment 62 between them, and the cylinder portion may be fitted to the heatsink in the same manner as the piston is fitted to the motherboard. The segment 64 of the piston component between the piston and the middle cap, and the segment 66 of the cylinder component between the cylinder and the middle cap, may be of any suitable length and diameter.

The reader will appreciate that the positions of the piston and cylinder may be reversed, in some embodiments. The reader will further appreciate that the cylinder end may be open, to permit removal of the piston component, or it may be substantially closed, to prevent removal of the piston component.

The reader will appreciate that the invention may readily be used in applications where the microelectronic die is coupled directly to the motherboard, or those employing an interposer, or those in which the die is socketed, and so forth.

The skilled reader will appreciate that the utilization of this invention may permit the removal or reduction of board stiffeners on the motherboard, the use of larger form factor and higher mass heat sinks, and/or thinner motherboards. The skilled reader will further appreciate that the utilization of this invention may also enable the heatsink attachment to withstand more extreme usage environments that result in higher shock or vibration.

The reader will appreciate that the term "motherboard" should not be interpreted as meaning only the primary or main board of an electronic system, but that this invention may be utilized in conjunction with a wide variety of boards and the like. The skilled reader will also appreciate that the term "shock absorber" refers to any suitable dampening mechanism, and is not limited to the coaxial piston and cylinder embodiment illustrated above by way of simplicity and teaching.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. An apparatus comprising:
   a board;
   a semiconductor device coupled to the board;
   a heatsink thermally contacting the semiconductor device;
   a heatsink support member coupled between the heatsink and the board; and
   a shock absorber coupled to the heatsink and to the board, wherein the heat sink support member comprises a spring.

2. A heatsink comprising:
   a thermally conductive body;
   a shock absorber comprising a piston and a cylinder; and
   means for mounting the shock absorber between the thermally conductive body and a substrate.

3. The heatsink of claim 2 wherein the means for mounting comprises:
   a keyhole slot.

4. The heatsink of claim 2 wherein the means for mounting comprises:
   a threaded hole.

5. A method of preventing at least one of shock induced motion and vibratory motion between a heatsink and a board, the method comprising:
   holding the heatsink down to the board; and
   dampening the at least one of shock induced motion and vibratory motion with a shock absorber coupled between the heatsink and the board, said shock absorber comprising a cylinder and a piston.

6. The method of claim 5 wherein the holding the heatsink down comprises:
   holding the heatsink down with at least one hold-down bolt.

7. The method of claim 5 wherein the holding the heatsink down comprises:
   holding the heatsink down with the shock absorber in a topped out configuration.

8. A method of preventing a heatsink from breaking a flip chip die to which the heatsink is coupled, the method comprising:
   retaining the heatsink in a substantially stationary position relative to the flip chip die; and
   dampening motion of the heatsink relative to the flip chip die; the dampening comprising actuating a pneumatic shock absorber coupled between the heatsink and a substrate.

9. An apparatus comprising:
   a board;
   a semiconductor device coupled to the board;
   a heatsink;
   a plurality of hold-down bolts coupled to the board and to the heatsink to thermally couple the heatsink to the semiconductor device;
   a plurality of springs coupled to the board and to the heatsink, supporting the heatsink under compression; and
   a plurality of shock absorbers coupled to the heatsink and to the board.

10. The apparatus of claim 9 wherein:
    the shock absorbers each comprise a piston and a cylinder; and
    in an ambient state, the shock absorbers have their pistons substantially mid-travel within their cylinders.

11. An apparatus comprising:
    a board;
    a semiconductor device coupled to the board;
    a heatsink; and
    a plurality of shock absorbers coupled to the heatsink and to the board and disposed within a plurality of springs.

12. The apparatus of claim 11 wherein:
    the shock absorbers each comprise a piston and a cylinder; and
    in an ambient state, the shock absorbers have their pistons topped out in their cylinders under tension to hold the heatsink down to the board.

13. An apparatus comprising:
    a board;
    a semiconductor device coupled to the board;
    a heatsink;
    a plurality of springs coupled to the board and to the heatsink; and
    a plurality of shock absorbers coupled to the heatsink and to the board and each including,
        a cylinder component coupled to one of the heatsink and the board, and
        a piston component coupled to the other of the heatsink and the board,
        the piston component being substantially mid-travel within the cylinder component when the heatsink and board are substantially at rest.

14. The apparatus of claim 13 wherein:
    the semiconductor device comprises a flip-chip die coupled to a card.

15. A shock absorber for coupling a heatsink to a motherboard, the shock absorber comprising:
    a cylinder component;
    a piston component; and
    one of the cylinder component and the piston component including,
        an end cap having a first circumferential dimension,
        a middle cap having a second circumferential dimension, and
        a segment between the middle cap and the end cap and having a third circumferential dimension smaller than the first and second circumferential dimensions and having a length substantially the thickness of the motherboard.

16. The shock absorber of claim 15 wherein:
    the other of the cylinder component and the piston component including,
        an end cap having a fourth circumferential dimension,
        a middle cap having a fifth circumferential dimension, and
        a segment between the middle cap and the end cap and having a sixth circumferential dimension smaller than the fourth and fifth circumferential dimensions and having a length substantially the thickness of a portion of the heatsink to which the shock absorber is to be coupled.

17. The shock absorber of claim 15 wherein:
    the other of the cylinder component and the piston component includes,
        a threaded end segment.

* * * * *